(12) United States Patent
Rosendale

(10) Patent No.: US 9,899,083 B1
(45) Date of Patent: Feb. 20, 2018

(54) METHOD, SYSTEM AND DEVICE FOR NON-VOLATILE MEMORY DEVICE OPERATION WITH LOW POWER HIGH SPEED AND HIGH DENSITY

(71) Applicant: ARM Ltd., Cambridge (GB)

(72) Inventor: Glen Arnold Rosendale, Palo Alto, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/340,567

(22) Filed: Nov. 1, 2016

(51) Int. Cl.
G11C 11/00 (2006.01)
G11C 13/00 (2006.01)

(52) U.S. Cl.
CPC ........ *G11C 13/0069* (2013.01); *G11C 13/004* (2013.01); *G11C 13/0007* (2013.01); *G11C 13/0011* (2013.01); *G11C 13/0097* (2013.01)

(58) Field of Classification Search
None
See application file for complete search history.

(56) References Cited

U.S. PATENT DOCUMENTS

| | | | |
|---|---|---|---|
| 5,671,179 A * | 9/1997 | Javanifard | G11C 16/30 365/185.33 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 2008/0107801 A1 | 5/2008 | Celinska et al. | |
| 2013/0285699 A1 | 10/2013 | McWilliams et al. | |
| 2014/0064011 A1 * | 3/2014 | Otterstedt | G11C 5/143 365/228 |
| 2016/0172024 A1 * | 6/2016 | Ma | G11C 11/56 365/148 |
| 2017/0033782 A1 | 2/2017 | Shifren | |
| 2017/0045905 A1 | 2/2017 | Sandhu et al. | |
| 2017/0047115 A1 | 2/2017 | Aitken et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |
| 2017/0077400 A1 | 3/2017 | Shifren et al. | |

(Continued)

*Primary Examiner* — Harry W Byrne
*Assistant Examiner* — Sultana Begum
(74) *Attorney, Agent, or Firm* — Berkeley Law & Technology Group, LLP (57) ABSTRACT

Disclosed are methods, systems and devices for operation of non-volatile memory devices. In one aspect, a read operation or a particular write operation may be performed on a correlated electron switch (CES) device by coupling a terminal of the CES device to a particular node through any one of multiple different resistive paths.

16 Claims, 8 Drawing Sheets

(56) References Cited

U.S. PATENT DOCUMENTS

| | | |
|---|---|---|
| 2017/0084331 A1 | 3/2017 | Bhavnagarwala et al. |
| 2017/0092858 A1 | 3/2017 | Shifren |
| 2017/0099049 A1 | 4/2017 | Sandhu et al. |
| 2017/0103809 A1 | 4/2017 | Bhavnagarwala et al. |
| 2017/0110191 A1 | 4/2017 | Aitken et al. |
| 2017/0117043 A1 | 4/2017 | Sandhu et al. |
| 2017/0147207 A1 | 5/2017 | Hansson et al. |
| 2017/0178718 A1 | 6/2017 | Savanth et al. |
| 2017/0178724 A1 | 6/2017 | Bhavnagarwala et al. |
| 2017/0179385 A1 | 6/2017 | Shifren et al. |
| 2017/0206963 A1 | 7/2017 | Bhavnagarwala et al. |
| 2017/0207784 A1 | 7/2017 | Das et al. |
| 2017/0213592 A1 | 7/2017 | Bhavnagarwala et al. |
| 2017/0213960 A1 | 7/2017 | Paz De Araujo et al. |
| 2017/0213961 A1 | 7/2017 | Paz De Araujo et al. |
| 2017/0237001 A1 | 8/2017 | Reid et al. |
| 2017/0243621 A1 | 8/2017 | Aitken et al. |
| 2017/0243622 A1 | 8/2017 | Sandhu et al. |
| 2017/0243646 A1 | 8/2017 | Shifren et al. |
| 2017/0244027 A1 | 8/2017 | Reid et al. |
| 2017/0244032 A1 | 8/2017 | Reid et al. |
| 2017/0250340 A1 | 8/2017 | Paz De Araujo et al. |

\* cited by examiner

METHOD, SYSTEM AND DEVICE FOR NON-VOLATILE MEMORY DEVICE OPERATION WITH LOW POWER HIGH SPEED AND HIGH DENSITY

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the first memory cell state. In a particular implementation, a CES device may switch resistive states responsive to a Mott-transition in a majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a "read operation." In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. A "programming signal" as referred to herein means a condition applied across terminals of a device to affect a physical state such as in a write operation. In one example implementation, a programming signal may comprise a current between terminals of a device and a voltage applied across terminals of the device to place the device in a particular impedance state. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 1A:
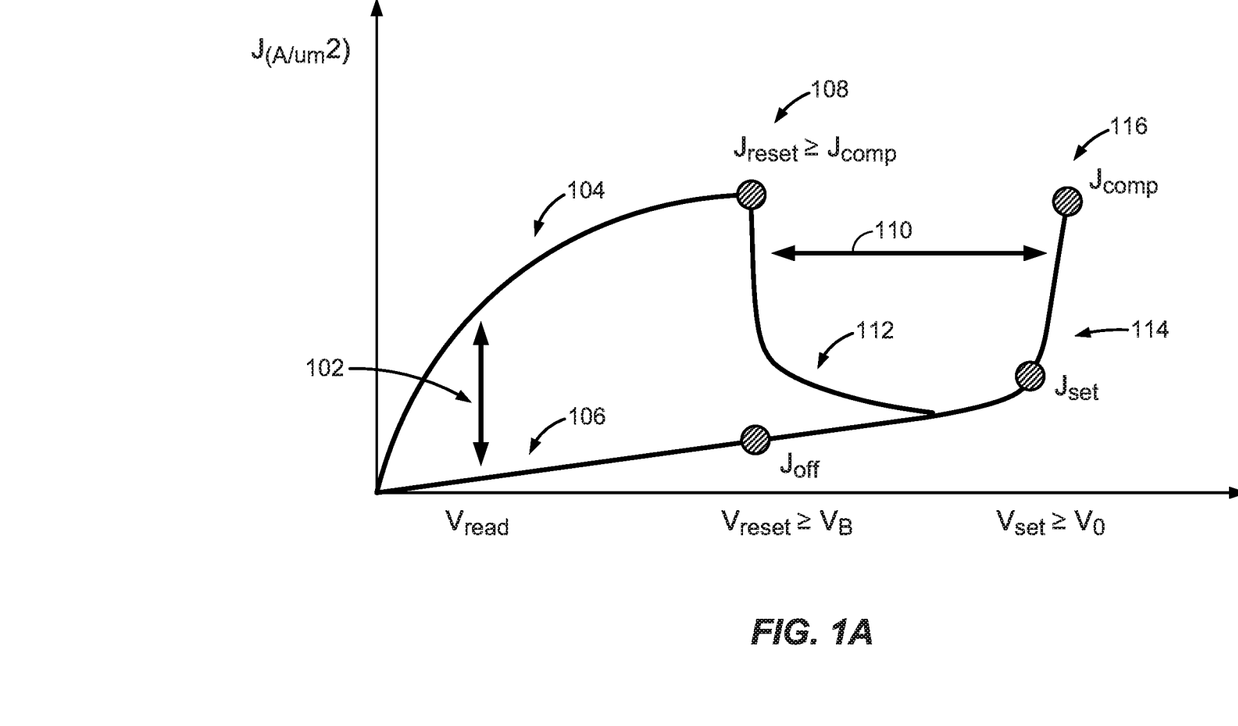
FIG. 1A shows a plot of current density versus voltage for a CES device according to an embodiment.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a low impedance or conductive memory state and application of a voltage $V_{reset}$ and a current density $J_{reset}$ may place the CES device in a high impedance or insulative memory state. Following placement of the CES in an insulative state or conductive memory state, the particular state of the CES device may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable impedance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in an insulative state. This externally applied compliance current may also set a condition of a current density for a subsequent reset operation to place the CES in a conductive state. As shown in the particular implementation of FIG. 1A, a current density $J_{comp}$ applied during a write operation at point 116 to place the CES device in conductive or low impedance state may determine a compliance condition for placing the CES device in an insulative or high impedance state in a subsequent write operation. As shown, the CES device may be subsequently placed in an insulative or high impedance state by application of a current density $J_{reset} \geq J_{comp}$ at a voltage $V_{reset}$ at point 108, where $J_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

where:

$\lambda_{TF}$ is a Thomas Fermi screening length; and

C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (3) as follows:

$$I_{MI}(V_{MI}) = \frac{dQ(V_{MI})}{dt} \approx \frac{Q(V_{MI})}{t} \quad (3)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (3) according to expression (1), a dependency of such a critical voltage $V_{MI}$ on Thomas Fermi screening length $\lambda_{TF}$ may be modeled according to expression (4) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (4)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:

$A_{CeRam}$ is a cross-sectional area of a CES element; and $J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (6) as follows:

$$I_{MI}(V_{MI}) = \frac{dQ(V_{MI})}{dt} \approx \frac{Q(V_{MI})}{t} \quad (6)$$

$$Q(V_{MI}) = qn(V_{MI})$$

$$I_{IM}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{IM}(V_{MI}) = \frac{I_{IM}(V_{MI})}{A_{CeRam}} = \frac{q}{A_{CeRam}t}\left(\frac{C}{a_B}\right)^3$$

where:

AB is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (7) as follows:

$$\lambda_{TF}(@V_{reset}) = a_B\left(\frac{J_{reset}}{J_{off}}\right)^{\frac{1}{3}} \quad (7)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
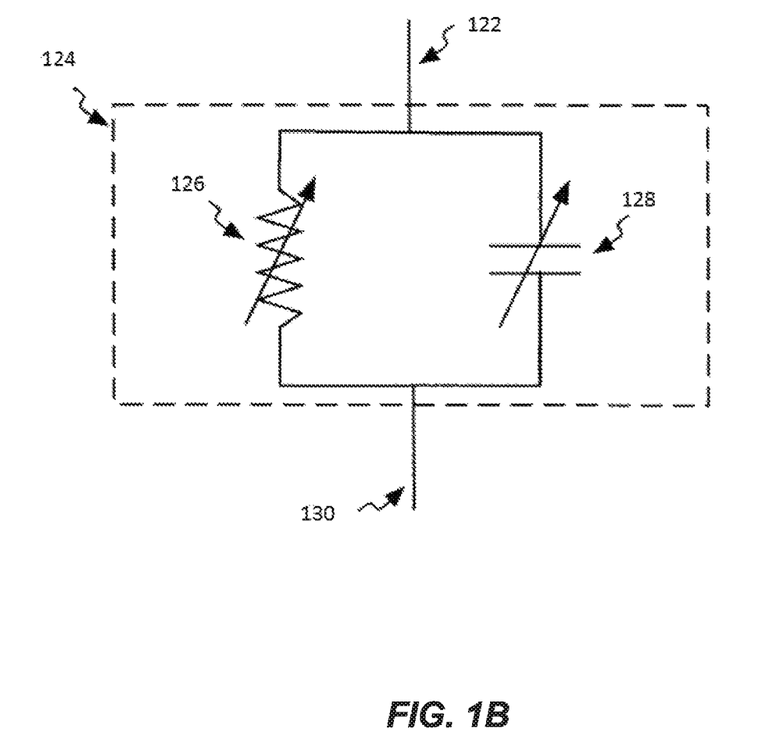
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 2:
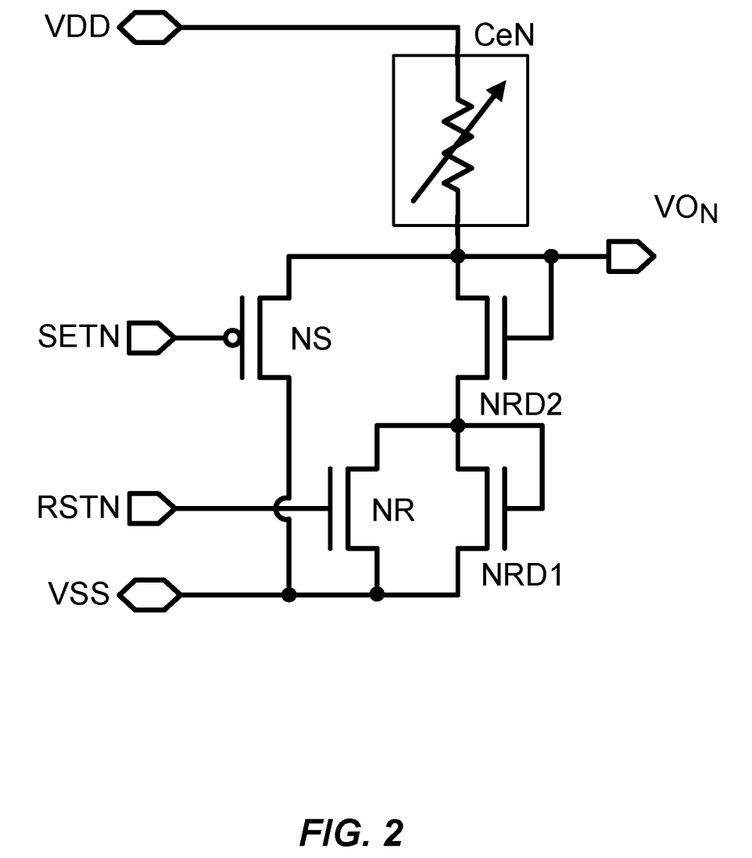
FIG. 2 is schematic diagram of a circuit for applying operations to a non-volatile memory element according to an embodiment.

FIG. 2 is schematic diagram of a circuit for applying operations to a non-volatile memory element according to an embodiment. Here, the circuit of FIG. 2 comprises a non-volatile memory element CeN, which may comprise a CES element such as a CeRAM element as discussed above. A first terminal of Non-volatile memory element CeN is coupled to a voltage supply VDD and a second terminal of non-volatile memory element CeN may be coupled to a common source voltage VSS through any one of multiple different resistive paths for particular write or read operations. In this context, a "resistive path" means one or more paths, either alone or in combination, to permit current to flow between nodes in a network. Such a resistive path may comprise, for example, conductive material such as metals, semiconductive materials or structures, resistive materials, just to provide a few examples. In one example, a resistive path may comprise conducting elements that may be in a particular open or closed state in combination with low resistance materials such as metals. In addition, a resistive path may comprise multiple paths through which current may flow between nodes. It should be understood, however, that these are merely examples of a resistive path, and claimed subject matter is not limited in this respect.

In one example, in a set operation to place non-volatile memory element CeN in a low impedance or conductive state, a voltage of signal SETN may be raised to close FET NS, providing a conducting element to couple the second terminal of non-volatile memory element CeN to common source voltage VSS in a first resistive path. In this context, a "voltage supply" means a circuit element that generates a voltage level at one or more nodes relative to one or more reference nodes. In one implementation, a voltage supply may comprise a circuit to generate a predetermined voltage level. It should be understood, however, that this is merely an example of a voltage supply, and claimed subject matter is not limited in this respect. In this context, a "common source voltage" means one or more nodes maintained at a particular voltage level. In one particular implementation, a common source voltage may comprise a voltage maintained at one or more reference nodes such as a ground node or a node at 0.0V relative to a voltage maintained by a voltage supply. It should be understood, however, that this is merely an example of a common source voltage, and claimed subject matter is not limited in this respect.

In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that these are merely examples of conducting elements in the description and drawings provided for illustration, and that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Diode coupled FETs NRD1 and NRD2 in series are closed and provide a resistive path in parallel with FET NS. Having a common drain-gate connection, FETs NRD1 and NRD2 may each have a voltage drop equal to an FET turn-on voltage (e.g., each may impart voltage drop of a 0.4V). Accordingly, while FETs NS and NR are both in an open state and a drop across each of FETs NRD1 and NRD2 is 0.4V, a voltage across non-volatile memory device CeN may be VDD—(VSS+2.0×0.4V).

Figure 3:
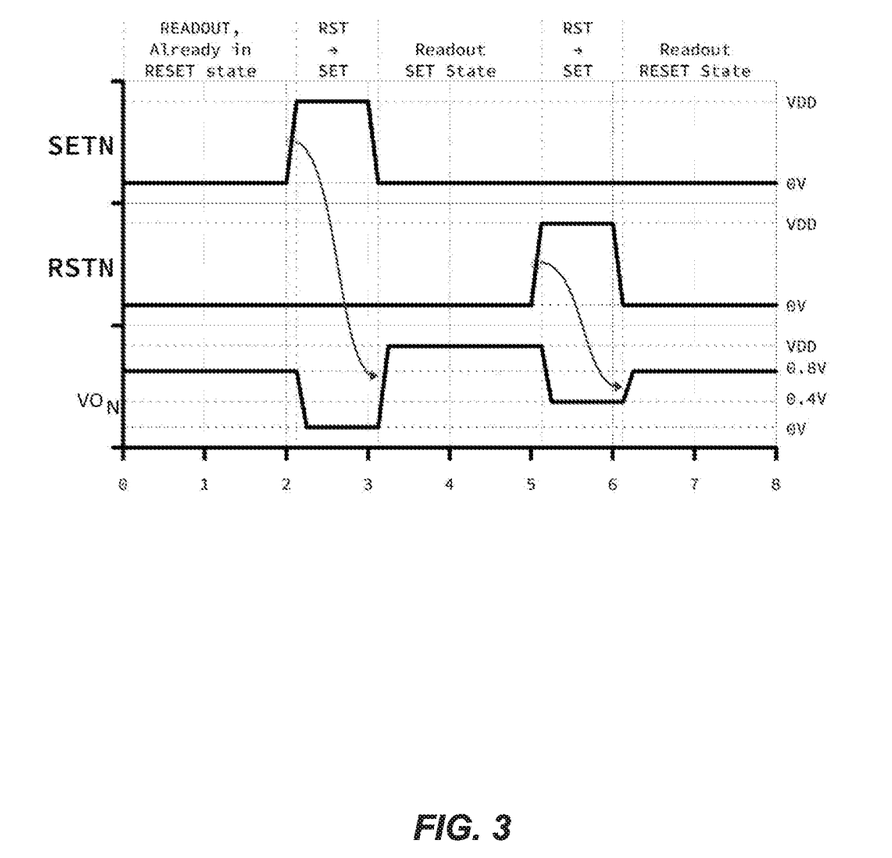
FIG. 3 is a timing diagram for operations applied to a non-volatile memory device according to a particular embodiment.

A resulting voltage drop in a resistive path between the second terminal of non-volatile memory element CeN and common source voltage through FET NS may provide a voltage $V_{set}$ sufficient to place non-volatile memory element CeN in a conductive or low impedance state in a set operation as discussed above. States of signals to place non-volatile memory element CeN in a conductive or low impedance state may be shown in the timing diagram of FIG. 3 between times 2 and 3 in which the voltage of signal SETN is raised while a voltage on signal RSTN remains low.

In a reset operation to place non-volatile memory element CeN in a high impedance or insulative state, a voltage of signal SETN may be maintained low (to place FET NS in an open state) while a voltage of signal RSTN may be raised to close FET NR. Closing FET NR may provide a conductive element to couple the second terminal of non-volatile memory element CeN to common source voltage VSS in a resistive path including diode coupled FET NRD2, in series with NR in parallel with diode coupled FET NRD1. Here, a resulting voltage drop between the second terminal of non-volatile memory element CeN and common source voltage, including a voltage drop across diode coupled FET NRD2 (e.g., approximately 0.4V) and negligible drop across closed FET NR, may provide a voltage $V_{reset}$ and current $I_{reset}$ sufficient to place non-volatile memory element CeN in an insulative or high impedance state in a reset operation as discussed above. States of signals to place non-volatile memory element CeN in an insulative or high impedance state may be shown in the timing diagram of FIG. 3 between times 5 and 6 in which the voltage of signal RSTN is raised while a voltage on signal SETN remains low.

According to an embodiment, a read operation to detect a current state of non-volatile memory element CeN may provide a particular signal VO at an output terminal indicative of the current state. Here, voltages of signals RSTN and SETN may be maintained low (placing FETs NS and NR in open states leaving a single resistive path between the second terminal and VSS through diode coupled FETs NRD1 and NRD2 in series) while a voltage of signal VO may be sampled at the output terminal. This is illustrated in the timing diagram of FIG. 3 between times 4 and 5 to read a conductive or low impedance state, and between times 7 and 8 to read an insulative or high impedance state.

Figure 4:
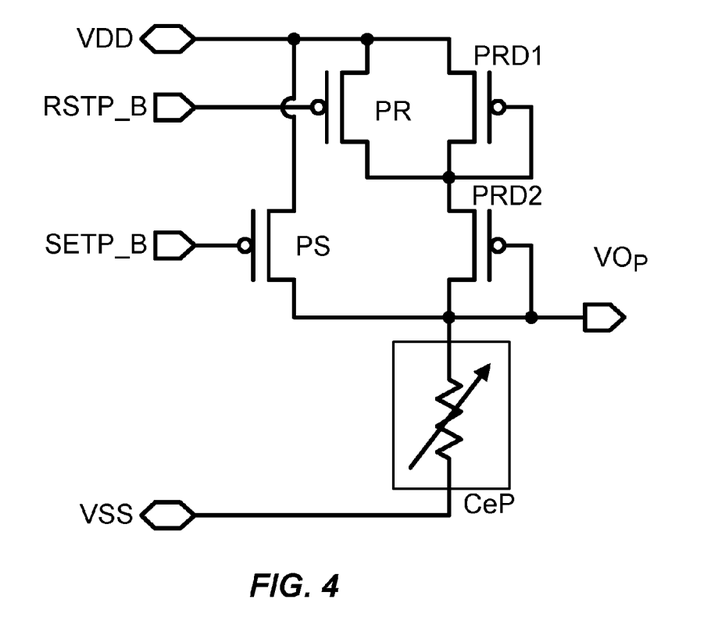
FIG. 4 is schematic diagram of a circuit for applying operations to a non-volatile memory element according to an alternative embodiment.

The particular implementation of FIG. 2 employs NFETs to provide conducting elements to form different resistive paths between the second terminal of non-volatile memory element CeN and common source voltage VSS. FIG. 4 is schematic diagram of a circuit for applying operations to a non-volatile memory element according to an alternative embodiment in which PFETs are used to form resistive paths between a first terminal of a non-volatile memory element CeP and voltage supply VDD. Here, common source voltage VSS is coupled to a first terminal of non-volatile memory element CeP while a second terminal of non-volatile memory element CeP may be coupled to voltage supply VDD by one or more resistive paths formed by PFETs PS, PR, PRD1 and PRD2.

Figure 5:
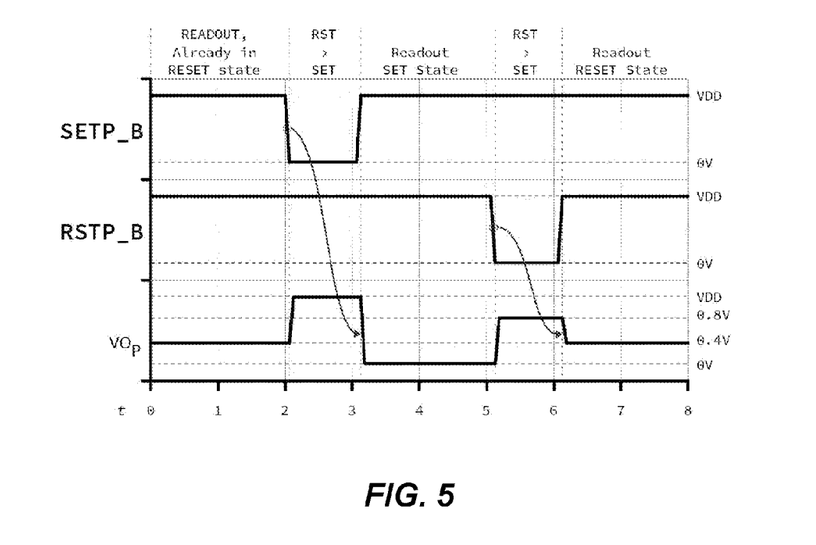
FIG. 5 is a timing diagram for operations applied to a non-volatile memory device according to an alternative embodiment.

For example, in a set operation to place non-volatile memory element CeP in a low impedance or conductive state, a voltage of signal SETP_B may be lowered to close FET PS, providing a conductive element to couple the second terminal of non-volatile memory element CeP to voltage supply VDD in a first resistive path. Diode coupled FETs PRD1 and PRD2 have a common drain-gate connection, each having a voltage drop equal to an FET turn-on voltage (e.g., each may impart voltage drop of a 0.4V). Being in series, FETs PRD1 and PRD2 provide a resistive path in parallel with FET PS. Here, a resulting voltage difference between the second terminal of non-volatile memory element CeN and common source voltage may provide a voltage $V_{set}$ and current $I_{set}$ sufficient to place non-volatile memory element CeP in a conductive or low impedance state in a set operation as discussed above. States of signals to place non-volatile memory element CeP in a conductive or low impedance state may be shown in the timing diagram of FIG. 5 between times 2 and 3 in which the voltage of signal SETP_B is lowered while a voltage on signal RSTP_B remains high.

In a reset operation to place non-volatile memory element CeP in a high impedance or insulative state, a voltage of signal SETP_B may be maintained high (to place FET PS in an open state) while a voltage of signal RSTP_B may be lowered to close FET PR. Closing FET PR may provide a conductive element to couple the second terminal of non-volatile memory element CeP to voltage supply VDD in a resistive path including diode coupled FET PRD2 imparting a voltage drop (e.g., a voltage drop of approximately 0.4V), in series with diode coupled FET PRD1 in parallel with FET PR. A voltage drop through diode coupled FET PRD1 in parallel with FET PR may be negligible. A resulting voltage drop between the second terminal of non-volatile memory element CeP and voltage supply VDD (primarily a voltage drop through diode coupled FET PRD2) may provide a voltage $V_{reset}$ and current $I_{reset}$ across terminals of non-volatile memory element CeP sufficient to place non-volatile memory element CeP in an insulative or high impedance state in a reset operation as discussed above. States of signals to place non-volatile memory element CeP in an insulative or high impedance state may be shown in the timing diagram of FIG. 5 between times 5 and 6 in which the voltage of signal RSTP_B is lowered while a voltage on signal SETP_B remains high.

According to an embodiment, a read operation to detect a current state of non-volatile memory element CeP may provide a particular signal VO at an output terminal indicative of the current state of CeP. Here, voltages of signals RSTP_B and SETP_B may be maintained high (placing FETs PS and PR in open states leaving a single resistive path between the second terminal and VSS through diode coupled FETs PRD1 and PRD2 in series) while a voltage of signal VO may be sampled at the output terminal. This is illustrated in the timing diagram of FIG. 5 between times 4 and 5 to read a conductive or low impedance state, and between times 7 and 8 to read an insulative or high impedance state.

Figure 6:
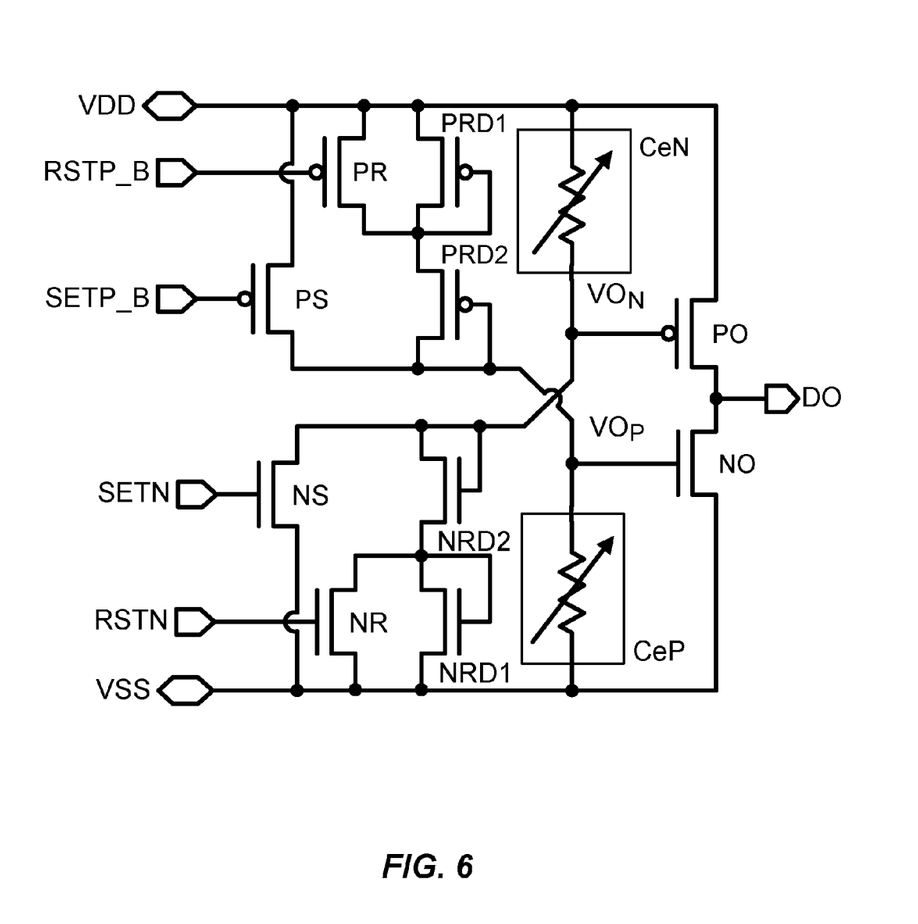
FIG. 6 is schematic diagram of a circuit for applying operations to multiple non-volatile memory elements according to an alternative embodiment.

FIG. 6 is schematic diagram of a circuit for applying operations to multiple non-volatile memory elements combining features of the circuits shown in FIGS. 2 and 4 according to an alternative embodiment. Here, non-volatile memory elements CeN and CeP may be configured to be in complementary states to represent different expressions, values, symbols, conditions or parameters, etc. (e.g., a "1" or "0"). For example, two complementary states of non-volatile memory elements CeN and CeP may represent either of two corresponding different expressions, values or symbols. For example, in a first complementary state representing a first expression, value or symbol non-volatile memory element CeN may be maintained a low impedance or conductive state and non-volatile memory element CeP may be maintained in a high impedance or insulative state. In a second complementary state representing a second expression, value, symbol, condition or parameter may be represented by maintaining non-volatile memory element CeN in a high impedance or insulative state and non-volatile memory element CeP in a low impedance or conductive state.

Figure 7:
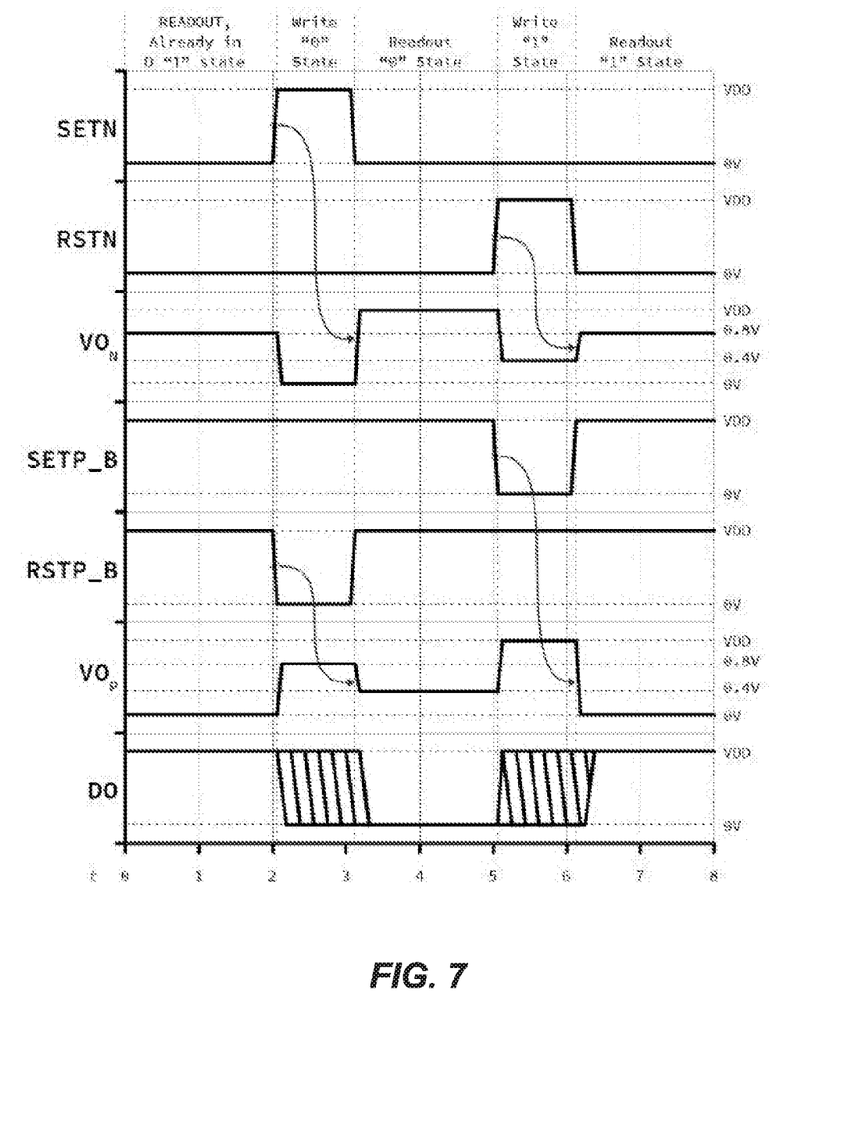
FIG. 7 is a timing diagram for operations applied to multiple non-volatile memory devices according to an alternative embodiment.

As may be observed, output signal $VO_N$, having a voltage determined based on a current state of non-volatile memory element CeN, is provided to a gate of FET PO while output signal $VO_P$, having a voltage determined based on a current state of non-volatile memory element CeP, is provided to a gate of FET NO. In the first complementary state mentioned above, CeN is maintained a low impedance or conductive state and non-volatile memory element CeP is maintained in a high impedance or insulative state. This may occur in response to the write operation illustrated from time 2 to 3 in the timing diagram of FIG. 7. This may place voltages of output signals $VO_N$ and $VO_P$ on the gates of FETs PO and NO are high in a subsequent read operation at time 4 to 5 in FIG. 7, opening FET PO and closing FET NO. In this state, a voltage of data output signal DO is fixed at the common source voltage VSS. In the second complementary state mentioned above, CeN is maintained a high impedance or insulative state and non-volatile memory element CeP is maintained in a low impedance or conductive state. This may occur in response to the write operation illustrated from time 5 to 6 in the timing diagram of FIG. 7. This may place voltages on the gates of FETs PO and NO low, closing FET PO and opening FET NO. In this state, a voltage of data output signal DO will be fixed at the voltage supply VDD in a subsequent read operation at time 7 to 8 in FIG. 7.

As may be observed, a voltage of data output signal DO is fixed to at either common source voltage VSS or voltage supply VDD in read operations, depending on whether non-volatile memory elements CeN and CeP are in the aforementioned first or second complementary state. This may avoid or eliminate use of complicated sense amplifier circuitry to sense impedance states of non-volatile memory elements CeN and CeP as representing a particular expression, value, symbol, parameter or condition.

Figure 8:
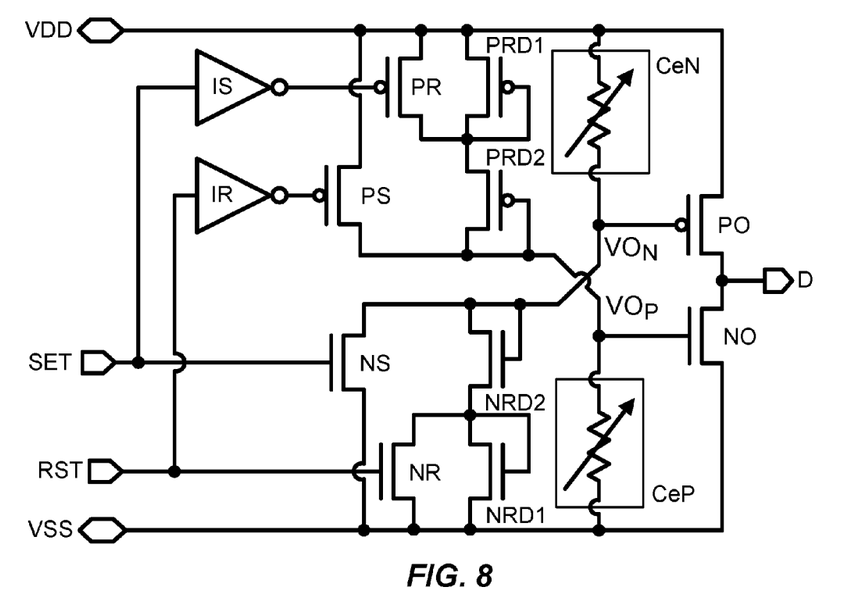
FIGS. 8 and 9 are schematic diagrams of circuits for applying operations to multiple non-volatile memory elements according to an alternative embodiment.

As shown in the alternative implementation of FIG. 8, the circuit of FIG. 6 may be simplified to eliminate terminals to receive signal RSTP_B (for a reset operation to place non-volatile memory element CeP in a high impedance or insulative state) and signal SETP_B (for a reset operation to place non-volatile memory element CeP in a low impedance or insulative state) by including inverters IS and IR responsive to signals SET and RST.

Figure 9:
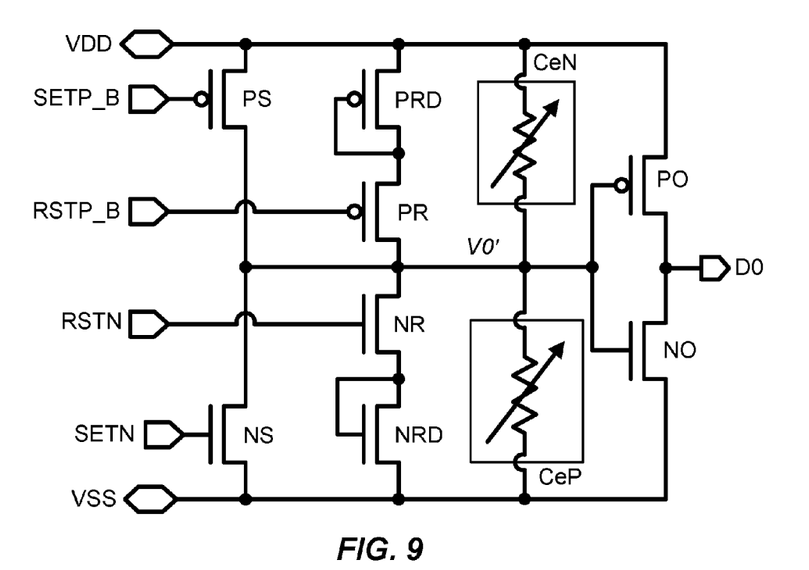

In another alternative implementation as shown in FIG. 9, the circuit of FIG. 6 may be simplified by combining output signals VO$_N$ and VO$_P$ to a single output signal VO' applied to the gates of FETs NO and PO, and eliminating two diode coupled FETs. In a write operation to place non-volatile memory elements CeN and CeP in the first complementary state, FET NS may be closed and FET NR may be opened to allow a set operation on non-volatile memory element CeN, and FET PS may be opened and FET PR may be closed to enable a reset operation on non-volatile memory element CeP. In a subsequent read operation, the voltage of output signal VO' may be high to fix the voltage of data out signal DO to common voltage source VSS. Similarly, in a write operation to place non-volatile memory elements CeN and CeP in the second complementary state, FET NS may be opened and FET NR may be closed to allow a reset operation on non-volatile memory element CeN, and FET PS may be closed and FET PR may be opened to enable a set operation on non-volatile memory element CeP. In a subsequent read operation, the voltage of output signal VO' may be low to fix the voltage of data out signal DO to voltage supply VDD.

Being in complementary impedance states, at any one time either non-volatile memory element CeN or non-volatile memory element CeP may be in a conductive or low impedance state. During a read operation, to prevent an unintended reset operation on the non-volatile memory element in the conductive or low impedance state, current through this non-volatile memory element may be limited to below a current level $I_{reset}$. In a read operation, FETs NS, PS, NR and PR may be in an open state such that the current through non-volatile memory elements CeN and CeP is roughly VDD−VSS divided by the combined resistance of non-volatile memory elements CeN and CeP. Here, the particular non-volatile memory element in the high impedance or insulative state may significantly limit current through non-volatile memory elements CeN and CeP in a read operation so as to prevent an unintended reset operation on the non-volatile memory element in the conductive or low impedance state.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A device comprising:
   a first non-volatile memory element comprising a first terminal coupled to a voltage supply and a second terminal; and
   one or more first conductive elements to selectively couple the second terminal of the first non-volatile element to a common source voltage through one or more first selected resistive paths so as to apply at least a first voltage between the first and second terminals in a read operation, and selectively couple the second terminal of the first non-volatile memory element to the common source voltage through one or more second selected resistive paths so as to apply at least a second voltage between the first and second terminals in a write operation,
   wherein at least a first of the one or more second selective paths applies a first programming signal between the first and second terminals of the first non-volatile memory element to place the first non-volatile memory element in a first impedance state, and a least a second of the one or more second selective paths applies a second programming signal between the first and second terminals of the first non-volatile memory element to place the first non-volatile memory element in a second impedance state.

2. The device of claim 1, wherein at least one of the one or more first resistive paths comprises a series of diode coupled field effect transistors (FETs).

3. The device of claim 1, wherein the first programming signal comprises a first programming signal voltage and a first programming signal current, and wherein the second programming signal comprises a second programming signal voltage and a second programming signal current, wherein a magnitude of the first programming signal current is greater than a magnitude of the second programming signal current, and wherein a magnitude of the second programming signal voltage is greater than a magnitude of the first programming signal voltage.

4. The device of claim 1, and further comprising:
   a second non-volatile memory element comprising a first terminal coupled to the common source voltage and a second terminal; and
   one or more second conductive elements to selectively couple the second terminal of the second non-volatile memory element to the supply voltage through one or more third selected resistive paths so as to apply at least a third voltage between the first and second terminals in the read operation, and selectively couple the second terminal of the second non-volatile memory element to the supply voltage through one or more fourth second selected resistive paths so as to apply at least a fourth voltage between the first and second terminals in the write operation.

5. The device of claim 4, and further comprising:
   an output terminal; and
   one or more third conducting elements to couple the output terminal to the supply voltage or the common source voltage based, at least in part, on an impedance state of the first non-volatile memory element or an impedance state of the second non-volatile memory element, or both.

6. The device of claim 4, wherein impedance states of the first and second non-volatile memory elements responsive to the write operation represent a first symbol, value, expression, condition or parameter if first non-volatile memory element is in a high impedance or insulative state and the second non-volatile memory element is in a low impedance or conductive state, and represent a second symbol, value, expression, condition or parameter if first non-volatile memory element is in the low impedance or conductive state and the second non-volatile memory element is in the high impedance or insulative state.

7. The device of claim 1, wherein the first non-volatile memory element comprises a correlated electron switch (CES) element.

8. The device of claim 1, wherein the first non-volatile memory element comprises a correlated electron random access memory element.

9. The device of claim 1, wherein the first impedance state comprises a high impedance or insulative state and the second impedance state comprises a low impedance or conductive state.

10. A method comprising:
while a first terminal of a first non-volatile memory element is coupled to a voltage supply, selectively coupling a second terminal of the first non-volatile memory element to a common source voltage through one or more first selected resistive paths so as to apply at least a first voltage between the first and second terminals in a read operation;
while the first terminal of the first non-volatile memory element is coupled to the voltage supply, selectively coupling the second terminal of the first non-volatile memory element to the common source voltage through one or more second selected resistive paths so as to apply at least a second voltage between the first and second terminals in a first write operation to place the first non-volatile memory element in a first impedance state; and
while the first terminal of the first non-volatile memory element is coupled to the voltage supply, selectively coupling the second terminal of the first non-volatile memory element to the common source voltage through one or more third selected resistive paths so as to apply at least a third voltage between the first and second terminals in a second write operation to place the first non-volatile memory element in a second impedance state.

11. The method of claim 10, wherein selectively coupling the second terminal of the first non-volatile memory element to the common source voltage through one or more second selected resistive paths so as to apply at least the second voltage between the first and second terminals in the first write operation further comprises applying a first programming signal between the first and second terminals of the first non-volatile memory element to place the first non-volatile memory element in a high impedance or insulative state.

12. The method of claim 10, wherein the first programming signal comprises a first programming signal voltage and a first programming signal current, and wherein the second programming signal comprises a second programming signal voltage and a second programming signal current, wherein a magnitude of the first programming signal current is greater than a magnitude of the second programming signal current, and wherein a magnitude of the second programming signal voltage is greater than a magnitude of the first programming signal voltage.

13. The method of claim 10, and further comprising:
while a first terminal of a second non-volatile memory element is coupled to the voltage supply, selectively coupling a second terminal of the second non-volatile memory element to the supply voltage through one or more third selected resistive paths so as to apply at least a fourth voltage between the first and second terminals in the read operation; and
selectively coupling the second terminal of the second non-volatile memory element to the supply voltage through one or more fourth second selected resistive paths so as to apply at least a fifth voltage between the first and second terminals in the first write operation.

14. The method of claim 13, and further comprising coupling an output terminal to the supply voltage or the common source voltage based, at least in part, on an impedance state of the first non-volatile memory element or an impedance state of the second non-volatile memory element, or both.

15. The method of claim 10, wherein the first non-volatile memory element comprises a correlated electron switch (CES) element.

16. The method of claim 10, wherein the first non-volatile memory element comprises a correlated electron random access memory element.

* * * * *